(12) United States Patent
Ishige et al.

(10) Patent No.: US 11,031,746 B2
(45) Date of Patent: Jun. 8, 2021

(54) SEMICONDUCTOR LASER MODULE

(71) Applicant: FURUKAWA ELECTRIC CO., LTD., Tokyo (JP)

(72) Inventors: Yuta Ishige, Tokyo (JP); Maiko Ariga, Tokyo (JP); Masaki Iwama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/539,384

(22) Filed: Aug. 13, 2019

(65) Prior Publication Data
US 2019/0363511 A1 Nov. 28, 2019

Related U.S. Application Data

(63) Continuation of application No. PCT/JP2018/004897, filed on Feb. 13, 2018.

(30) Foreign Application Priority Data

Feb. 14, 2017 (JP) .............................. JP2017-024645

(51) Int. Cl.
*H01S 5/02251* (2021.01)
*H01S 5/042* (2006.01)
(Continued)

(52) U.S. Cl.
CPC ........ *H01S 5/02251* (2021.01); *H01S 5/0428* (2013.01); *H01S 5/1078* (2013.01); *G02B 6/42* (2013.01)

(58) Field of Classification Search
CPC .. H01S 5/02284; H01S 5/0428; H01S 5/1078; H01S 5/022; H01S 5/02251;
(Continued)

(56) References Cited

U.S. PATENT DOCUMENTS 3,421,097 A * 1/1969 Koester ............... H01S 3/06754
359/341.1
4,575,181 A 3/1986 Ishikawa
(Continued)

FOREIGN PATENT DOCUMENTS

CN 101441301 A 5/2009
CN 105449499 A 3/2016
(Continued)

OTHER PUBLICATIONS

International Search Report dated May 1, 2018 in PCT/JP2018/004897 filed Feb. 13, 2018 (with English Translation).
(Continued)

*Primary Examiner* — Xinning(Tom) Niu
(74) *Attorney, Agent, or Firm* — Oblon, McClelland, Maier & Neustadt, L.L.P.

(57) ABSTRACT

A semiconductor laser module includes a semiconductor laser device that outputs laser light; an optical fiber that includes a core portion and a cladding portion formed at an outer periphery of the core portion and that receives the laser light from one end and guides the laser light to the outside of the semiconductor laser module; an optical part disposed at an outer periphery of the optical fiber, having optical transmittance at a wavelength of the laser light, and that fixes the optical fiber; a first fixative that fixes the optical part and the optical fiber; and a housing that accommodates the semiconductor laser device and the one end of the optical fiber that receives the laser light, wherein an optical reflection reducing region treated to absorb the laser light and having a rough surface is formed around the optical part.

17 Claims, 8 Drawing Sheets

(51) Int. Cl.
*H01S 5/10* (2021.01)
*G02B 6/42* (2006.01)

(58) Field of Classification Search
CPC .............. H01S 5/4031; H01S 5/02423; H01S 5/02326; H01S 5/02469; H01S 5/02208; H01S 5/4012; G02B 6/42; G02B 6/4296; G02B 6/4204; G02B 6/4214; G02B 6/4207
See application file for complete search history.

(56) References Cited

U.S. PATENT DOCUMENTS

| | | | |
|---|---|---|---|
| 5,127,072 | A | 6/1992 | Blauvelt et al. |
| 7,068,690 | B2 | 6/2006 | Okazaki et al. |
| 7,891,885 | B2 | 2/2011 | Ariga et al. |
| 9,746,627 | B2 | 8/2017 | Ishige et al. |
| 2009/0129427 | A1 | 5/2009 | Ariga et al. |
| 2009/0245315 | A1 | 10/2009 | Faybishenko |
| 2016/0246022 | A1* | 8/2016 | Ishige ................ G02B 6/4206 |

FOREIGN PATENT DOCUMENTS

| | | | |
|---|---|---|---|
| CN | 105518505 | A | 4/2016 |
| JP | 11-074612 | A | 3/1999 |
| JP | 2004-096088 | A | 3/2004 |
| JP | 2004-354771 | A | 12/2004 |
| JP | 2008-153639 | A | 7/2008 |
| JP | WO 2015/037725 | * | 3/2015 |
| JP | 2016-144823 | A | 8/2016 |
| WO | WO 2015/037725 | A1 | 3/2015 |

OTHER PUBLICATIONS

Written Opinion dated May 1, 2018 in PCT/JP2018/004897 filed Feb. 13, 2018.
Japanese Office Action dated Dec. 1, 2020 in Japanese Patent Application No. 2017-024645 (with unedited computer generated English translation), 11 pages.
Combined Chinese Office Action and Search Report dated Aug. 20, 2020, in Patent Application No. 201880011950.0 (with English translation), 16 pages.
Extended European Search Report dated Nov. 3, 2020 in European Patent Application No. 18753897.0, 8 pages.

* cited by examiner

SEMICONDUCTOR LASER MODULE

CROSS-REFERENCE TO RELATED APPLICATION(S)

This application is a continuation of International Application No. PCT/JP2018/004897, filed on Feb. 13, 2018, which claims the benefit of priority of the prior Japanese Patent Application No. 2017-024645, filed on Feb. 14, 2017, the entire contents of which are incorporated herein by reference.

BACKGROUND

The present disclosure relates to a semiconductor laser module.

To output laser light from an optical fiber in a semiconductor laser module, conventionally known are a method for condensing the laser light radiated from semiconductor laser devices fixed at predetermined positions in a package through lenses and the like and coupling the laser light to the optical fiber (refer to Japanese Laid-open Patent Publication No. 2004-96088, for example).

In the optical coupling method described above, if the semiconductor laser devices are high-power devices, an adhesive for fixing the optical fiber and a covering portion of the optical fiber may possibly be damaged by heat generated by light absorption, resulting in reduced reliability. To address this, conventionally known is a method for fixing the optical fiber by inserting the optical fiber into a transparent glass capillary (refer to Japanese Laid-open Patent Publication No. 2004-354771, for example). With the glass capillary, however, the adhesive and the covering portion may possibly be damaged by generated heat in the semiconductor laser module. To address this, the present inventors disclose a highly reliable semiconductor module that prevents the adhesive and the covering portion from being damaged (refer to International Patent Publication No. WO 2015/037725, for example).

SUMMARY

According to one aspect of the present disclosure includes a semiconductor laser device that outputs laser light; an optical fiber that includes a core portion and a cladding portion formed at an outer periphery of the core portion and that receives the laser light from one end and guides the laser light to the outside of the semiconductor laser module; an optical part disposed at an outer periphery of the optical fiber, having optical transmittance at a wavelength of the laser light, and that fixes the optical fiber; a first fixative that fixes the optical part and the optical fiber; and a housing that accommodates the semiconductor laser device and the one end of the optical fiber that receives the laser light, wherein an optical reflection reducing region treated to absorb the laser light and having a rough surface is formed around the optical part.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Exemplary embodiments according to the present disclosure are described below with reference to the accompanying drawings. The embodiments are not intended to limit the disclosure. In the drawings, like or corresponding components are appropriately denoted by like reference numerals. The drawings are schematic illustrations, and it should be noted that the relation between the sizes of the components and the ratio between the components may possibly be different from those in an actual configuration. The relation between the sizes and the ratio may possibly be different between the drawings.

Figure 1:
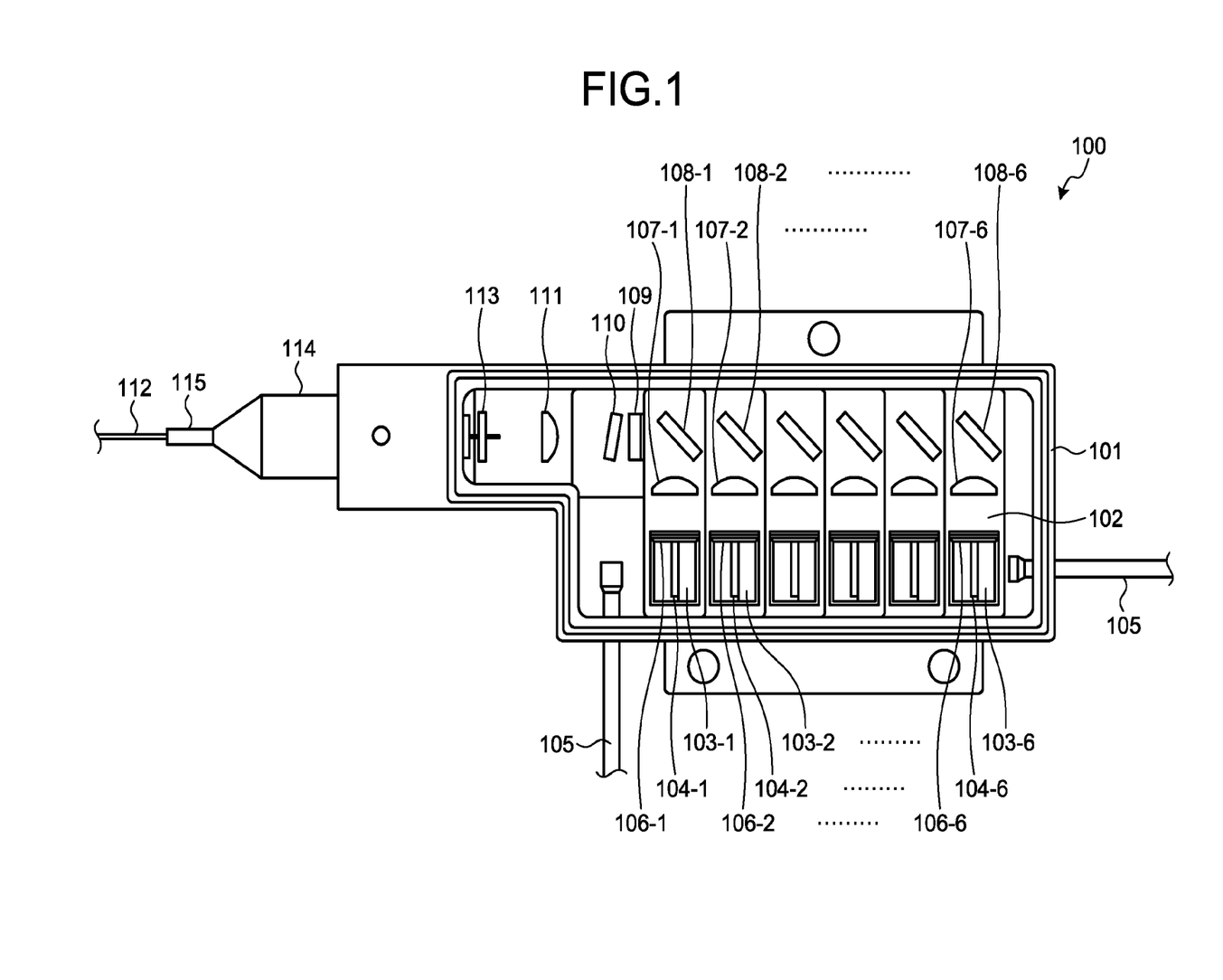
FIG. 1 is a schematic plan view of a semiconductor laser module according to an embodiment of the present disclosure.
Figure 2:
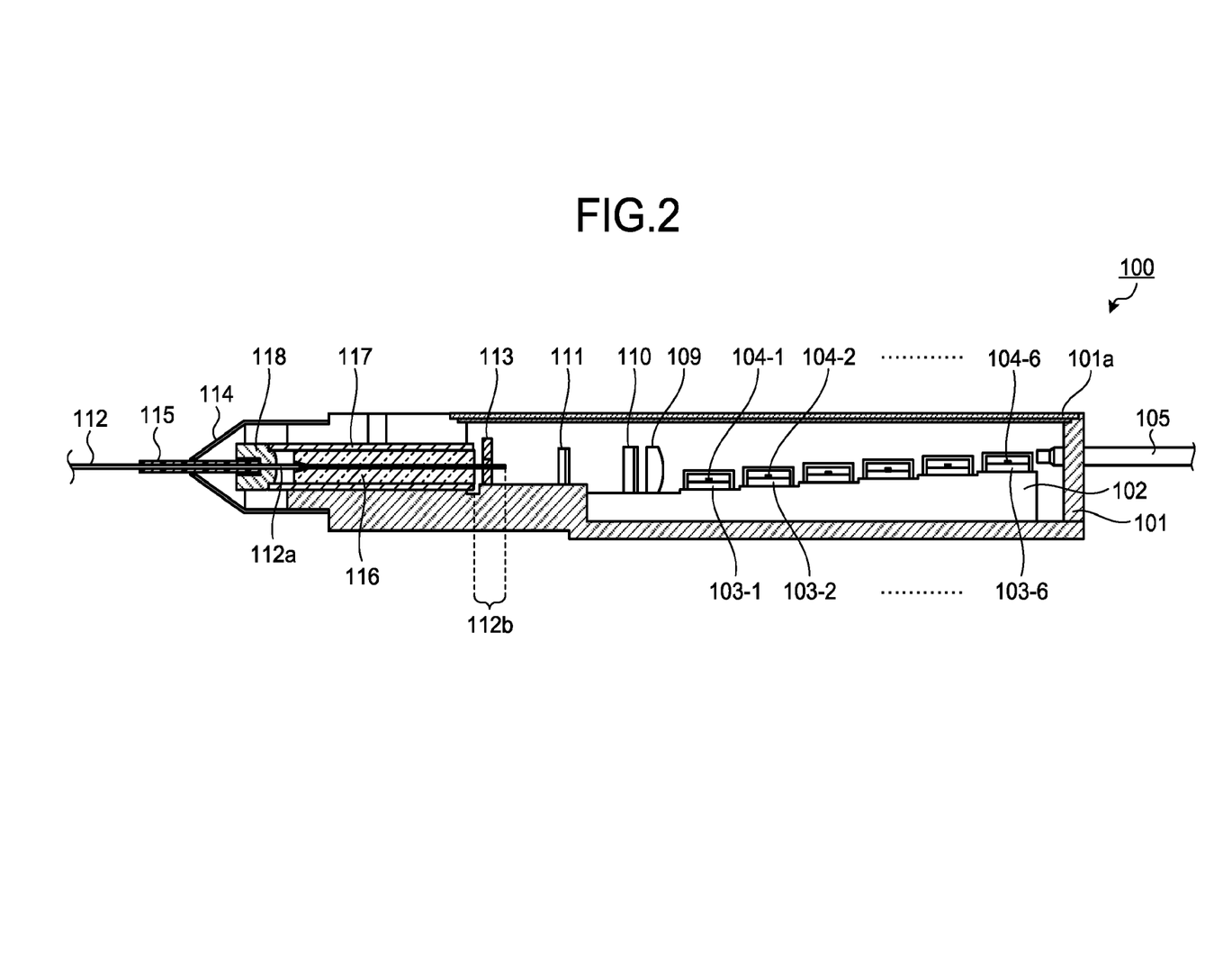
FIG. 2 is a schematic partially cut-out view of a side surface of the semiconductor laser module illustrated in FIG. 1.

The configuration of a semiconductor laser module according to an embodiment of the present disclosure is described first. FIG. 1 is a schematic plan view of the semiconductor laser module according to the embodiment of the present disclosure. FIG. 2 is a schematic partially cut-out view of a side surface of the semiconductor laser module illustrated in FIG. 1. A semiconductor laser module 100 according to the present embodiment includes a package 101 serving as a housing, an LD height adjustment plate 102 provided stepwise in the package 101, sub-mounts 103-1 to 103-6, and six semiconductor laser devices 104-1 to 104-6. While the package 101 includes a lid 101a as illustrated in FIG. 2, FIG. 1 does not illustrate the lid of the package 101. The semiconductor laser module 100 also includes lead pins 105 for injecting a current into the semiconductor laser devices 104-1 to 104-6. The semiconductor laser module 100 also includes first lenses 106-1 to 106-6, second lenses 107-1 to 107-6, mirrors 108-1 to 108-6, a third lens 109, an optical filter 110, and a fourth lens 111, which are optical elements disposed in order on an optical path of laser light output from the semiconductor laser devices 104-1 to 104-6. The first lenses 106-1 to 106-6, the second lenses 107-1 to 107-6, the mirrors 108-1 to 108-6, the third lens 109, the optical filter 110, and the fourth lens 111 are fixed in the package 101. The semiconductor laser module 100 also includes an optical fiber 112 disposed facing the fourth lens 111. An end of the optical fiber 112 that receives the laser light is accommodated in the package 101.

As illustrated in FIG. 2, the semiconductor laser devices 104-1 to 104-6 are disposed stepwise by the LD height adjustment plate 102 in the package 101. The first lenses 106-1 to 106-6, the second lenses 107-1 to 107-6, and the mirrors 108-1 to 108-6 are each disposed at the same height as that of the corresponding semiconductor laser device.

An insertion portion of the optical fiber 112 into the package 101 is provided with a loose tube 115. A boot 114 is fit onto part of the package 101 in a manner covering part of the loose tube 115 and the insertion portion.

As illustrated in FIG. 2, the optical fiber 112 is inserted into a glass capillary 116 serving as an optical part. While the optical fiber 112 includes a covering portion 112a, the part of the optical fiber 112 inserted into the glass capillary 116 is not provided with the covering portion 112a. The optical fiber 112 has a protrusion 112b protruding from the glass capillary 116 as part thereof on an entrance side. The outer periphery of the glass capillary 116 is covered with a fixing member 117. The fixing member 117 is fixed to the package 101. The glass capillary 116 is provided with a second light-shielding portion 118 on a laser light exit side. The second light-shielding portion 118 is fitted into the fixing member 117 on the laser light exit side of the fixing member 117. The loose tube 115 is inserted into part of the second light-shielding portion 118.

Figure 3:
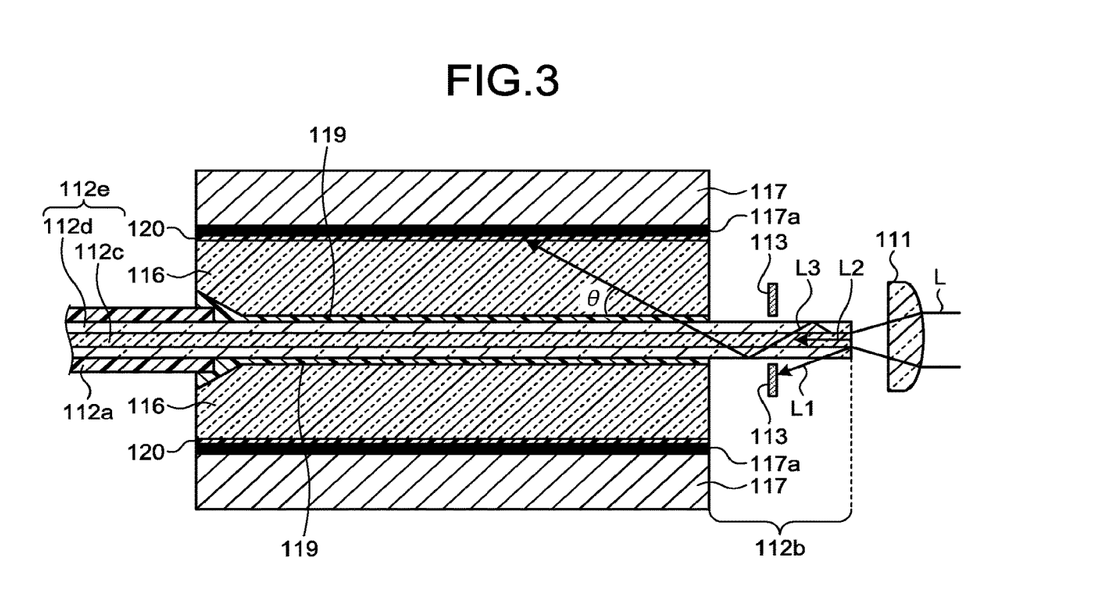
FIG. 3 is a schematic sectional view of an optical fiber, a glass capillary, and a fixing member of the semiconductor laser module illustrated in FIG. 1.

The following describes the configuration near the optical fiber 112 of the semiconductor laser module 100 in greater detail. FIG. 3 is a schematic sectional view of the optical fiber 112, the glass capillary 116, and the fixing member 117 of the semiconductor laser module 100 illustrated in FIG. 1. As illustrated in FIG. 3, the optical fiber 112 includes a core portion 112c and a cladding portion 112d. The core portion 112c and the cladding portion 112d constitute a glass optical fiber portion 112e of the optical fiber 112.

The optical fiber 112 is inserted into the glass capillary 116. The optical fiber 112 and the glass capillary 116 are fixed by a first fixative 119. The glass capillary 116 is inserted into the fixing member 117. The glass capillary 116 and the fixing member 117 are fixed by a second fixative 120.

The inner surface of the fixing member 117, that is, the surface facing the glass capillary 116 has an optical reflection reducing region 117a. The optical reflection reducing region 117a is a region formed by treating the inner surface of the fixing member 117 so as to absorb light and have a rough surface.

A first light-shielding portion 113 is disposed between the entrance end for the laser light of the optical fiber 112 and the glass capillary 116.

The following describes the components of the semiconductor laser module 100 illustrated in FIGS. 1 to 3 in greater detail. The package 101 serving as the housing is preferably made of a material having high thermal conductivity to suppress a rise in the internal temperature. The package 101 may be a metal member made of various kinds of metals. As illustrated in FIG. 2, the bottom surface of the package 101 is preferably separated from a surface on which the semiconductor laser module 100 is disposed in a region provided with the glass capillary 116. This structure can reduce the effects of warpage in the bottom surface of the package 101 when fixing the package 101 with screws, for example.

As described above, the LD height adjustment plate 102 is fixed in the package 101. The LD height adjustment plate 102 adjusts the heights of the semiconductor laser devices 104-1 to 104-6 to prevent the optical paths of the laser light output from the respective semiconductor laser devices 104-1 to 104-6 from interfering with one another. The LD height adjustment plate 102 may be provided integrally with the package 101.

The sub-mounts 103-1 to 103-6 are fixed on the LD height adjustment plate 102 and facilitates heat radiation from the respective semiconductor laser devices 104-1 to 104-6 placed thereon. Consequently, the sub-mounts 103-1 to 103-6 are preferably made of a material having high thermal conductivity and may be a metal member made of various kinds of metals.

The semiconductor laser devices 104-1 to 104-6 are high-power semiconductor laser devices that output the laser light having optical power of 1 W or more and more preferably 10 W or more. The optical power of the laser light output from the semiconductor laser devices 104-1 to 104-6 according to the present embodiment is 11 W, for example. The semiconductor laser devices 104-1 to 104-6 output the laser light having a wavelength of 900 nm to 1000 nm, for example. The semiconductor laser devices 104-1 to 104-6 may be a plurality of semiconductor laser devices like the semiconductor laser module 100 according to the embodiment or one semiconductor laser device. The number of semiconductor laser devices is not particularly limited.

The lead pins 105 supply electric power to the semiconductor laser devices 104-1 to 104-6 via a bonding wire, which is not illustrated. The electric power to be supplied may have a constant voltage or a modulated voltage.

The first lenses 106-1 to 106-6 are cylindrical lenses having a focal length of 0.3 mm, for example. The first lenses 106-1 to 106-6 are disposed at such positions that they convert the light output from the respective semiconductor laser devices into substantially collimated light in the vertical direction.

The second lenses 107-1 to 107-6 are cylindrical lenses having a focal length of 5 mm, for example. The second lenses 107-1 to 107-6 are disposed at such positions that they convert the light output from the semiconductor laser devices 104-1 to 104-6, respectively, into substantially collimated light in the horizontal direction.

The mirrors 108-1 to 108-6 include various kinds of metal coatings or dielectric coatings. At the wavelength of the laser light output from the semiconductor laser devices 104-1 to 104-6, the mirrors 108-1 to 108-6 preferably have higher reflectivity. The reflection direction of the mirrors 108-1 to 108-6 can be finely adjusted such that the laser light output from the respective semiconductor laser devices is appropriately coupled to the optical fiber 112.

The third lens 109 and the fourth lens 111 are cylindrical lenses having focal lengths of 12 mm and 5 mm, respectively, and curvatures orthogonal to each other, for example. The third lens 109 and the fourth lens 111 condense the laser light output from the semiconductor laser devices 104-1 to 104-6 and appropriately couple it to the optical fiber 112. The positions of the third lens 109 and the fourth lens 111 with respect to the optical fiber 112 are adjusted such that the coupling efficiency of the laser light output from the semiconductor laser devices 104-1 to 104-6 to the optical fiber 112 is 85% or more, for example.

The optical filter 110 is a low-pass filter that reflects light having a wavelength of 1060 nm to 1080 nm and allows light having a wavelength of 900 nm to 1000 nm to pass therethrough, for example. As a result, the optical filter 110 allows the laser light output from the semiconductor laser devices 104-1 to 104-6 to pass therethrough and prevents light having a wavelength of 1060 nm to 1080 nm from being radiated from the outside to the semiconductor laser devices 104-1 to 104-6. The optical filter 110 is angled with respect to the optical axis of the laser light so as to prevent the laser light output from the semiconductor laser devices 104-1 to 104-6 and slightly reflected by the optical filter 110 from returning to the semiconductor laser devices 104-1 to 104-6.

While the optical fiber 112 is a multi-mode optical fiber having a core diameter of 105 μm and a cladding diameter of 125 μm, for example, it may be a single-mode optical fiber. The NA of the optical fiber 112 is 0.15 to 0.22, for example.

The first light-shielding portion 113 is a rectangular plate member having a cutout. The protrusion 112b of the optical fiber 112 is inserted through the cutout, and the end of the optical fiber 112 protrudes from the first light-shielding portion 113. The first light-shielding portion 113 is disposed at the outer periphery of the protrusion 112b of the optical fiber 112 and separated from the optical fiber 112.

Incidentally, because the first light-shielding portion 113 is separated from the optical fiber 112, heat may be prevented from being transmitted from the first light-shielding portion 113 to the optical fiber 112 and suppress a rise in temperature of the first fixative 119, which will be described later.

Additionally, because the first light-shielding portion 113 is provided so that the end of the optical fiber 112 protrudes from the first light-shielding portion 113 on the input side for the laser light, leakage of non-coupled light may be suppressed from a gap between the first light-shielding portion 113 and the optical fiber 112, thereby shielding the non-coupled light not coupled to the optical fiber 112 more reliably.

The optical fiber 112 is inserted through the boot 114 and prevented from being damaged by bending. While the boot 114 is a metal boot, the material is not particularly limited and may be rubber, various kinds of resin, plastic, and the like.

The optical fiber 112 is inserted through the loose tube 115 and prevented from being damaged by bending. The loose tube 115 may be fixed to the optical fiber 112 to prevent positional deviation of the optical fiber 112 when force to pull the optical fiber 112 is applied in the longitudinal direction.

The glass capillary 116 is a cylindrical glass capillary having a through hole. In the glass capillary 116, the optical fiber 112 is inserted through the through hole. The inner wall of the through hole of the glass capillary 116 and the cladding portion 112d of the optical fiber 112 are fixed by the first fixative 119. The glass capillary 116 has optical transmittance at the wavelength of the laser light output from the semiconductor laser devices 104-1 to 104-6. The glass capillary 116 is preferably made of a material having transmissivity of 90□ or more at the wavelength, for example. The refractive index of the glass capillary 116 is preferably equal to or more than that of the cladding portion 112d of the optical fiber 112. As to a refractive index of the glass capillary 116, a relative refractive-index difference is, for example, 0.1□ or more and 10□ or less with respect to the cladding portion 112d of the optical fiber 112. The glass capillary 116 may have a tapered portion formed on the light exit side to facilitate insertion of the optical fiber 112.

The fixing member 117 is a tubular member disposed at the outer periphery of the glass capillary 116, for example, and is fixed to the glass capillary 116 by the second fixative 120. The optical reflection reducing region 117a is formed on substantially the whole inner surface of the fixing member 117. The optical reflection reducing region 117a has optical absorbance at the wavelength of the laser light output from the semiconductor laser devices 104-1 to 104-6. The optical reflection reducing region 117a preferably has optical absorptivity of 30% or more and more preferably 70% or more at the wavelength, for example. As a result, the optical reflection reducing region 117a absorbs the laser light passing through the glass capillary 116. Because the optical reflection reducing region 117a has a rough surface, it has higher optical absorptivity than a smooth surface and is less likely to reflect the laser light. The fixing member 117 converts energy of the laser light absorbed by the optical reflection reducing region 117a into heat and radiates the heat. To radiate heat, the fixing member 117 is preferably made of a material having high thermal conductivity. The fixing member 117 is preferably made of a metal member containing Cu, Ni, Al, stainless steel, or Fe, a member having a surface plating layer including a metal containing Ni, Cr, or Ti or including C, a ceramic member containing AlN, BeO, $ZrO_2$, SiC, or $Al_2O_3$, or a member having a ceramic layer covering the surface containing AlN, BeO, $ZrO_2$, SiC, or $Al_2O_3$, for example. To radiate heat, the fixing member 117 is preferably connected to the package 101 with a good thermal conductor, which is not illustrated, interposed therebetween. The good thermal conductor is preferably made of a material having thermal conductivity of 0.5 W/mK or more and is made of solder or a thermal conductive adhesive, for example.

The second light-shielding portion 118 is connected to the fixing member 117 and provided with the optical fiber 112 inserted thereinto. As a result, the second light-shielding portion 118 prevents light passing through the glass capillary 116 and emitted from the facet on the exit side of the glass capillary 116 from being radiated to the outside of the semiconductor laser module 100. Consequently, the second light-shielding portion 118 is preferably not damaged by the radiated light. The second light-shielding portion 118 is preferably made of a metal member containing Cu, Ni, Al, stainless steel, or Fe, a member having a surface plating layer containing Ni, Cr, or Ti, or a member having a dielectric multilayer coating, for example. The surface of the second light-shielding portion 118 facing the glass capillary 116 preferably has inclination or a curvature so as to reflect light incident on the surface in a direction away from the optical fiber 112.

The space surrounded by the second light-shielding portion 118, the fixing member 117, and the glass capillary 116 may be filled with the first fixative 119, the second fixative 120, other UV-cured resin, and silicone, for example.

The first fixative 119 and the second fixative 120 may be made of the same material or different materials. The first fixative 119 and the second fixative 120 are made of UV-cured resin, such as epoxy resin and urethane-based resin. The refractive index of the first fixative 119 is preferably equal to or more than that of the cladding portion 112d of the optical fiber 112 at 25□C and more preferably equal to or more than that of the cladding portion 112d of the optical fiber 112 at an operating temperature range of the semiconductor laser module 100 (e.g., 15□C to 100□C). The refractive index of the second fixative 120 is preferably equal to or more than that of the glass capillary 116 at 25□C and more preferably equal to or more than that of the glass capillary 116 at the operating temperature range of the semiconductor laser module 100 (e.g., 15□C to 100□C). The refractive indexes of the first fixative 119 and the second fixative 120 may be substantially equal to that of the glass capillary 116 and higher than that of the cladding portion 112d of the optical fiber 112. As to refractive indexes of the first fixative 119 and the second fixative 120, for example, a relative refractive-index difference is 0% or more and 10% or less with respect to the glass capillary 116. The thickness of the first fixative 119 and the second fixative 120 on a plane orthogonal to the longitudinal direction of the optical fiber 112 is preferably 1 μm or more and 800 μm or less. UV-cured resin, for example, is known to have a lower refractive index by including fluorine and have a higher refractive index by including sulfur. By adjusting the amounts of the materials contained to increase and decrease the refractive index, the refractive index can be adjusted.

The following describes operations performed by the semiconductor laser module 100 according to the present embodiment. The semiconductor laser devices 104-1 to 104-6 disposed stepwise are supplied with electric power from the lead pins 105 and output respective rays of laser light. The output rays of laser light are converted into substantially collimated light by the respective first lenses 106-1 to 106-6 and the respective second lenses 107-1 to 107-6. The rays of laser light are reflected by the respective mirrors 108-1 to 108-6 disposed at the corresponding height in the direction toward the optical fiber 112. The rays of laser light are condensed by the third lens 109 and the fourth lens 111 and coupled to the optical fiber 112. The laser light coupled to the optical fiber 112 is guided and output to the outside of the semiconductor laser module 100 by the optical fiber 112. With the differences in height between the semiconductor laser devices 104-1 to 104-6 and between the mirrors 108-1 to 108-6, the semiconductor laser module 100 prevents unnecessary loss in the laser light. When the optical power of the light output from the semiconductor laser devices 104-1 to 104-6 according to the present embodiment is 11 W, and the coupling efficiency is 85%, the optical power of the light output from the semiconductor laser module 100 is 56 W.

The following describes propagation of the laser light condensed by the third lens 109 and the fourth lens 111 in greater detail with reference to FIG. 3. While the laser light is technically refracted on interfaces depending on the refractive-index differences between the members, FIG. 3 does not illustrate the refraction to simplify the explanation. Laser light L condensed by the third lens 109 and the fourth lens 111 is divided into non-coupled light L1 not coupled to the optical fiber 112 and light L2 coupled to and propagating in the optical fiber 112. Most part of the light L2 coupled to the optical fiber 112 propagates in the core portion 112c of the optical fiber 112 and is guided and output to the outside of the semiconductor laser module 100. Part of the light L2, however, is coupled to the cladding portion 112d and becomes light L3 propagating in the cladding portion 112d. In addition, part of the light L2 propagating in the core portion 112c may possibly leak from the core portion 112c and become the light L3 propagating in the cladding portion 112d.

The non-coupled light L1 is prevented from entering into the glass capillary 116 by the first light-shielding portion 113, and part of the non-coupled light L1 is absorbed by the first light-shielding portion 113. Heat generated by the light absorption is radiated from the first light-shielding portion 113 to the package 101. To reliably prevent the non-coupled light L1 from entering into the glass capillary 116, the first light-shielding portion 113 is disposed at the protrusion 112b of the optical fiber 112. For this purpose, the first light-shielding portion 113 is preferably not damaged if being irradiated with part of the laser light. The first light-shielding portion 113 is preferably made of a metal member containing Cu, Ni, Al, stainless steel, or Fe, a member having a surface plating layer containing Ni, Cr, or Ti, or a member having a dielectric multilayer coating, for example. To reliably separate the first light-shielding portion 113 from the optical fiber 112 and sufficiently shield the light not coupled to the optical fiber 112, a distance (clearance) is preferably present between the first light-shielding portion 113 and the optical fiber 112 on the plane orthogonal to the longitudinal direction of the optical fiber 112. Because a beam of laser light typically has an elliptic shape, the clearance is preferably 5 μm or more and 500 μm or less in the major axis direction of the ellipse.

As described above, the light L3 propagating in the cladding portion 112d is generated in the cladding portion 112d.

The light L3 is confined in the cladding portion 112d of the optical fiber 112 at the protrusion 112b because of the refractive-index difference between the cladding portion 112d and external air and propagates in the cladding portion 112d of the optical fiber 112.

Subsequently, the light L3 reaches the interface between the cladding portion 112d and the first fixative 119. If the refractive index of the first fixative 119 is higher than that of the cladding portion 112d, the light L3 is more likely to pass through the interface. Furthermore, if the refractive index of the cladding portion 112d is equal to that of the first fixative 119, the light L3 is most likely to pass through the interface. While the light L3 passing through the interface (that is, leaking from the optical fiber 112) propagates in the first fixative 119, the first fixative 119 is prevented from being damaged because it has a sufficiently small thickness of 800 μm or less and sufficiently low optical absorptivity. The thickness of the first fixative 119 is more preferably 5 μm or less.

Subsequently, the light L3 reaches the interface between the first fixative 119 and the glass capillary 116. Also on this interface, if the refractive index of the glass capillary 116 is higher than that of the first fixative 119, the light L3 is more likely to pass through the interface. Furthermore, if the refractive index of the first fixative 119 is equal to that of the glass capillary 116, the light L3 is most likely to pass through the interface. The light L3 passing through the interface propagates in the glass capillary 116. The light L3 then passes through the glass capillary 116 because the glass capillary 116 has sufficiently high transmissivity of 90% or more.

Subsequently, the light L3 reaches the interface between the glass capillary 116 and the second fixative 120. Also on this interface, if the refractive index of the second fixative 120 is higher than that of the glass capillary 116, the light L3 is more likely to pass through the interface. Furthermore, if the refractive index of the glass capillary 116 is equal to that of the second fixative 120, the light L3 is most likely to pass through the interface. While the light L3 passing through the interface propagates in the second fixative 120, the second fixative 120 is prevented from being damaged because it has a sufficiently small thickness of 800 μm or less and sufficiently low optical absorptivity. The thickness of the second fixative 120 is more preferably 5 μm or less.

Subsequently, the light L3 reaches the fixing member 117. The light L3 is absorbed by the optical reflection reducing region 117a on the fixing member 117. Heat generated by the light absorption is radiated from the fixing member 117 to the package 101.

When the angle of the traveling direction of the light L3 leaking from the cladding portion 112d of the optical fiber 112 with respect to the central axis of the optical fiber 112 is θ as illustrated in FIG. 3, the angle θ falls within a predetermined range larger than a predetermined angle θa.

The glass capillary 116 preferably has a sufficiently long length to allow the light output from the optical fiber 112 at the angle θ to reach the fixing member 117. The glass capillary 116 more preferably has a sufficiently long length to allow the light not absorbed by the fixing member 117 and reflected by it to reach the fixing member 117 again. The length of the glass capillary 116 in the longitudinal direction of the cylinder is 3 mm or longer.

The inside diameter of the cylinder of the glass capillary 116 is preferably 0.13 mm or less to make the first fixative 119 sufficiently thin. The glass capillary 116 preferably has a certain thickness or more so as to prevent the heat generated by the light absorption by the optical reflection reducing region 117a of the fixing member 117 from damaging the first fixative 119 and the covering portion 112a of the optical fiber 112. The outside diameter of the cylinder is preferably 1.8 mm or more, for example.

The following describes the optical reflection reducing region 117a more specifically. The surface roughness of the optical reflection reducing region 117a preferably has an arithmetical mean roughness Ra, which is defined by JIS B 0601: 2000, of 0.05 µm≤Ra≤10 µm, for example. If 0.05 µm≤Ra is satisfied, advantageous effects of improving the optical absorptivity and reducing the optical reflection amount are appropriately achieved. If the arithmetical mean roughness Ra is too large, a flat surface may possibly be locally present in the roughened region, whereby light may possibly be reflected by the flat surface. If Ra≤10 µm is satisfied, the possibility of presence of such a flat surface is sufficiently low.

The optical reflection reducing region 117a is preferably formed by surface-treating the inner surface of the fixing member 117 by emitting thereto a laser beam for processing. When energy is given to the gold-plated surface by the laser beam for processing, a chemical reaction such as oxidation occurs to make the gold-plated surface blackish. As a result, the surface increases in optical absorption coefficient, and is roughened. The wavelength and the intensity of the laser beam for processing only need to be set so as to achieve desired values of the absorption coefficient and the surface roughness according to the material to be surface-treated.

To provide the reduced optical reflection area 117a at a desired area, it is preferable to provide the reduced optical reflection area 117a by surface-treating by emitting the laser beam for processing, because the area to be provided as the reduced optical reflection area 117a can be freely and accurately set. If, instead, for example, a coating is applied to reduce the stray light, a coating agent may spread out into an area where the coating is not required. As a result, the coating agent may possibly spread to the outside of the fixing member, for example, thereby having adverse effects when fixing the fixing member to the package.

Since the optical reflection reducing region 117a is provided by treating the constituent material of the fixing member 117, no additional member to reduce optical reflection is required, and the component cost can be prevented from increasing. In addition, an organic resin such as the coating agent is not used as a raw material. Therefore, even if the light L3 has a high intensity, no burning or strong oxidation resulting in breakage when being irradiated is caused.

When a pulsed laser beam is used as the laser beam for processing, heat generated on the irradiated surface by the irradiation with the pulsed laser beam easily diffuses. As a result, the irradiated surface can be prevented from being excessively treated or being broken by being heated. The wavelength, the peak power, and the duty ratio of the pulsed laser beam are adjusted to restrain the irradiated surface from an excessive temperature rise, and thus, suitable treating can be performed. According to the study of the inventors of the present disclosure, when the pulsed laser beam is used as the laser beam for processing, unevenness is formed on the irradiated surface at a period (approximately from 0.5 µm to 1.5 µm) reflecting the wavelength of the laser beam. This unevenness is preferable from the viewpoint of the surface roughening.

As described above, the semiconductor laser module 100 according to the present embodiment has the following advantageous effects. Specifically, the first light-shielding portion 113 prevents the non-coupled light from entering into the glass capillary 116. As a result, the semiconductor laser module 100 prevents the first fixative 119, the second fixative 120, the covering portion 112a, and other components from being damaged by the non-coupled light.

The semiconductor laser module 100 appropriately determines the refractive indexes of the members so as to make the light propagating in the cladding portion 112d likely to leak from the optical fiber 112 on the interfaces of the cladding portion 112d to the second fixative 120. This structure prevents the leaking light from being reflected by the interfaces. As a result, the leaking light is efficiently absorbed by the fixing member 117.

The semiconductor laser module 100 has the glass capillary 116 between the optical fiber 112 and the fixing member 117. This structure can reduce the density of the light leaking from the optical fiber 112 before the leaking light reaches the fixing member 117. Consequently, the semiconductor laser module 100 can suppress a rise in temperature of the fixing member 117.

The semiconductor laser module 100 includes the fixing member 117 with the optical reflection reducing region 117a formed thereon. Consequently, the semiconductor laser module 100 prevents the first fixative 119, the second fixative 120, and the covering portion 112a from being damaged by the light reflected by the fixing member 117.

In the semiconductor laser module 100, the first fixative 119 and the second fixative 120 are sufficiently thin. This structure prevents the first fixative 119 and the second fixative 120 from being damaged by light absorption. The semiconductor laser module 100 according to the present embodiment has the advantageous effects described above and is a highly reliable semiconductor laser module.

In the semiconductor laser module 100, the second light-shielding portion 118 has inclination or a curvature so as to reflect light incident thereon in a direction away from the optical fiber 112. This structure prevents the light incident on and reflected by the second light-shielding portion 118 from damaging the first fixative 119 at the tapered portion of the glass capillary 116. Consequently, the semiconductor laser module 100 is a highly reliable semiconductor laser module. The second light-shielding portion 118 prevents the light passing through the glass capillary 116 from being radiated to the outside of the semiconductor laser module 100 because leakage of the light passing through the glass capillary 116 to the outside of the semiconductor laser module 100 is undesirable for safety. Consequently, the semiconductor laser module 100 is a highly safe semiconductor laser module.

As described above, the semiconductor laser module 100 according to the present embodiment is a highly reliable and highly safe semiconductor laser module.

Modifications

The following describes modifications of the semiconductor laser module according to the embodiment above.

The semiconductor laser module according to the modifications can be obtained by replacing components of the semiconductor laser module according to the embodiment above by components according to the modifications described below.

Figure 4:
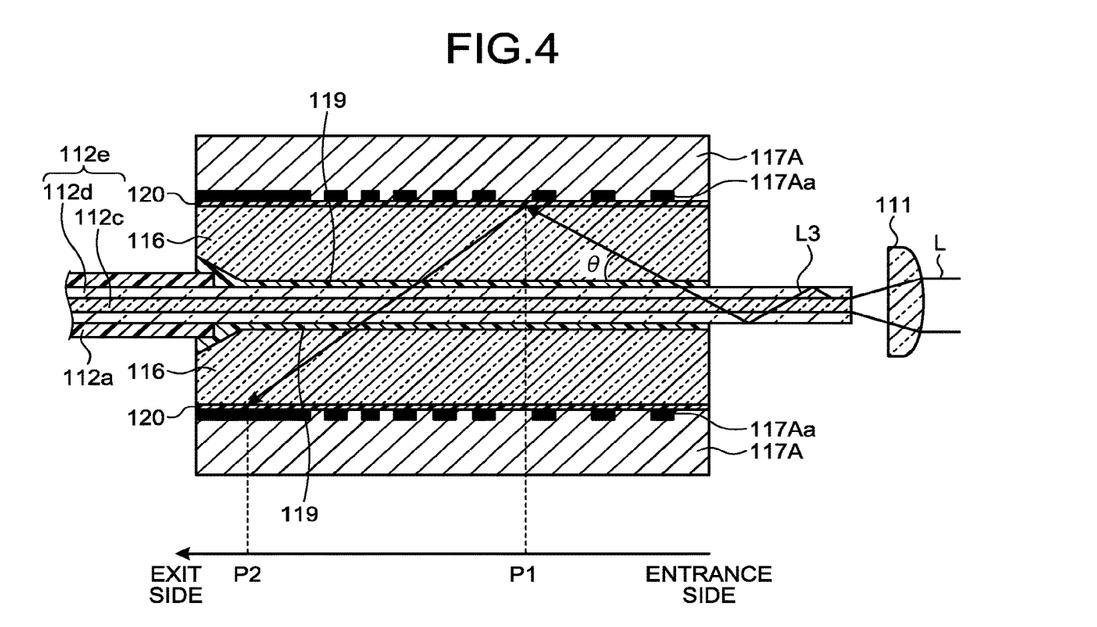
FIG. 4 is a schematic for explaining the fixing member of the semiconductor laser module according to a modification.

FIG. 4 is a schematic for explaining the fixing member of the semiconductor laser module according to a modification. In FIG. 4, the fixing member 117 in the configuration illustrated in FIG. 3 is replaced by a fixing member 117A. FIG. 4 does not illustrate the first light-shielding portion 113.

As illustrated in FIG. 4, as to the fixing member 117A according to the modification, the inner surface thereof selectively has an optical reflection reducing region 117Aa treated to absorb light and have a rough surface. Specifically, on the inner surface of the fixing member 117A at the entrance end for the laser light L of the optical fiber 112, the optical reflection reducing regions 117Aa and regions not provided with the optical reflection reducing region 117Aa are alternately present. In other words, the optical reflection reducing region 117Aa is formed discontinuously. While the optical reflection reducing region 117Aa has an annular shape, for example, the shape is not particularly limited. The gap between the optical reflection reducing regions 117Aa decreases from the entrance end toward the exit end for the laser light L of the optical fiber 112. The optical reflection reducing region 117Aa is formed continuously at the exit end. The surface roughness and the optical absorptivity of the optical reflection reducing region 117Aa are the same as those of the optical reflection reducing region 117a of the fixing member 117.

The optical reflection reducing regions 117Aa and regions not provided with the optical reflection reducing region 117Aa are alternately present at a position P1 where the light L3 leaks from the optical fiber 112 and reaches the fixing member 117A first. This structure enables adjustment of the absorption amount and the reflection amount of the light L3 at the position P1. Specifically, the beam of the light L3 is spread in a certain range. The light L3 reaching the optical reflection reducing region 117Aa within the range of spread of the beam of the light L3 is more intensively absorbed. By contrast, the light L3 reaching the region not provided with the optical reflection reducing region 117Aa is more intensively reflected. Consequently, the absorption amount and the reflection amount of the light L3 at the position P1 are adjusted, thereby preventing the absorption amount from excessively increasing. As a result, the modification can prevent the amount of heat generated by absorption of the light L3 from increasing locally at the position P1 and damaging the second fixative 120.

The light L3 reflected at the position P1 then reaches the fixing member 117A at a position P2. While the optical reflection reducing region 117Aa is formed continuously at the position P2, the amount of generated heat is prevented from increasing locally at the position P2 because the light L3 is partially absorbed at the position P1 and has lower power. As a result, the modification can prevent the second fixative 120 from being damaged.

As described above, the optical reflection reducing region 117Aa is formed discontinuously at the position P1 where the light L3 reaches the fixing member 117A first, thereby suppressing excessive light absorption. By contrast, the optical reflection reducing region 117Aa is formed continuously at the position P2 where the power of the light L3 is made lower, thereby sufficiently performing light absorption. This structure reduces the difference between the amounts of generated heat at the position P1 and the position P2 and more preferably makes the amounts of generated heat substantially equal to each other. Consequently, the amount of generated heat in the fixing member 117A is prevented from increasing locally. As a result, the fixing member 117A can prevent the second fixative 120 from being damaged, thereby increasing the reliability of the semiconductor laser module.

The period of presence of the optical reflection reducing region 117Aa is appropriately determined such that the amount of locally generated heat falls within an allowable range depending to an assumed power of the light L3 or an experimentally determined power of the light L3. Furthermore, the modification may reduce the amount of generated heat at the position P2 within the allowable range by forming the optical reflection reducing region 117Aa discontinuously also at the position P2.

If the optical reflection reducing region 117Aa is formed by surface-treating the inner surface of the fixing member 117A by selectively emitting the laser light for processing, the optical reflection reducing region 117Aa is accurately and selectively formed on the inner surface of the fixing member 117A.

Figure 5:
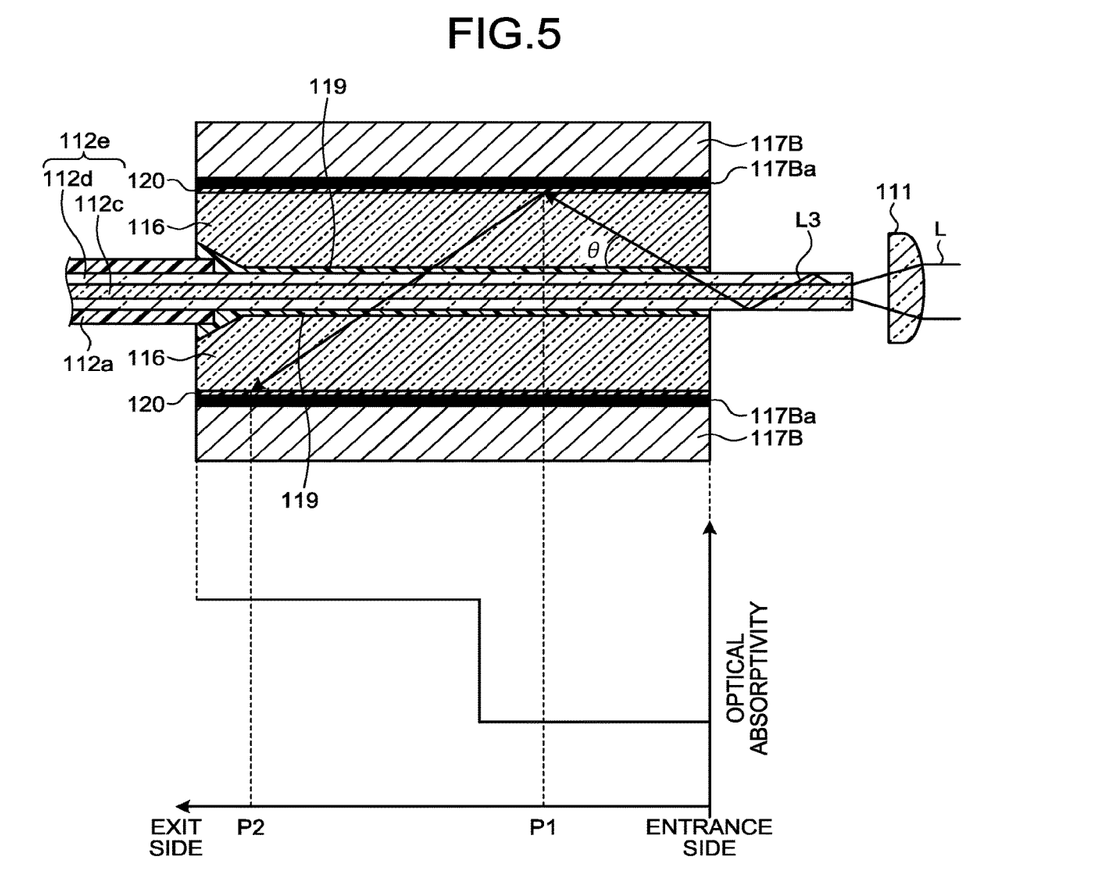
FIG. 5 is a schematic for explaining the fixing member of the semiconductor laser module according to another modification.

FIG. 5 is a schematic for explaining the fixing member of the semiconductor laser module according to another modification. In FIG. 5, the fixing member 117 in the configuration illustrated in FIG. 3 is replaced by a fixing member 117B. FIG. 5 does not illustrate the first light-shielding portion 113. As illustrated in FIG. 5, the inner surface of the fixing member 117B according to the modification has an optical reflection reducing region 117Ba such that the optical absorptivity gradually increases in two stages from the entrance end toward the exit end of the laser light L in the optical fiber 112.

Similarly to the fixing member 117A illustrated in FIG. 4, the fixing member 117B can reduce the difference between the amounts of generated heat at the position P1 where the light L3 leaks from the optical fiber 112 and reaches the fixing member 117B first and the position P2 where the light L3 reaches the fixing member 117B next and more preferably makes the amounts of generated heat substantially equal to each other. Consequently, the amount of generated heat is prevented from increasing locally. As a result, the fixing member 117B can increase the reliability of the semiconductor laser module.

To form such a profile in the optical absorptivity, the optical reflection reducing region 117Ba is formed such that the surface roughness (e.g., the arithmetical mean roughness) gradually increases from the entrance end toward the exit end for the laser light L. Metals and ceramics have higher optical absorptivity as the surface roughness of the light entrance surface is larger. Consequently, the optical absorptivity of the optical reflection reducing region 117Ba gradually increases from the entrance end toward the exit end. Alternatively, the optical reflection reducing region 117Ba may be formed such that the optical absorptivity of the material itself of the fixing member 117B gradually increases from the entrance end toward the exit end for the laser light L or such that both of the optical absorptivity and the surface roughness of the material itself gradually increases (is made larger). To form such a profile in the optical absorptivity, a method of irradiating the surface with pulse laser light having different power depending on the positions is suitably used. To form a region having higher optical absorptivity in the optical reflection reducing region 117Ba, for example, the power of the radiated pulse laser light is increased, thereby increasing (making higher) at least one of the optical absorptivity and the surface roughness.

Figure 6:
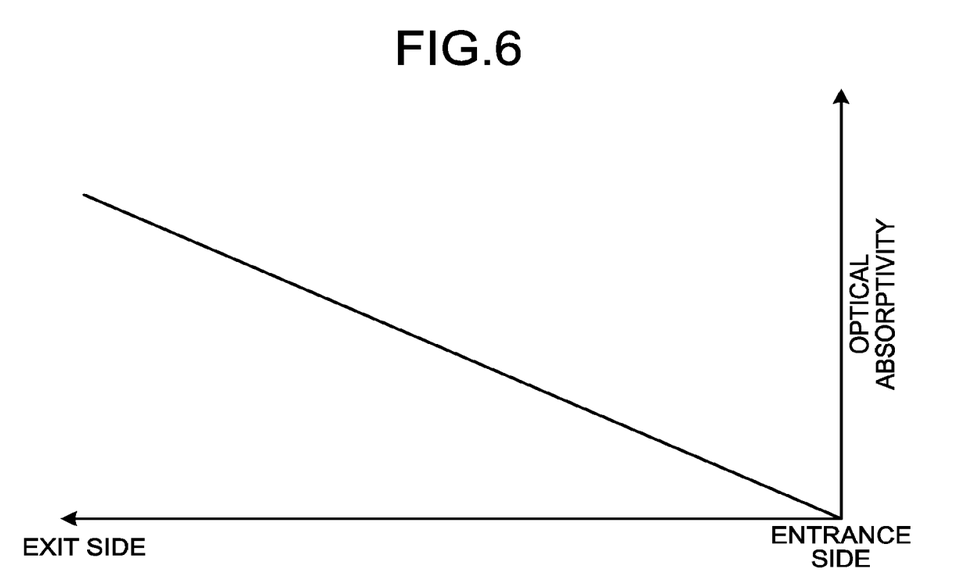
FIG. 6 is a diagram of another example of a profile of the optical absorptivity.

FIG. 6 is a diagram of another example of the profile of the optical absorptivity. In the example illustrated in FIG. 6, the optical reflection reducing region 117Ba is formed such that the optical absorptivity increases linearly and continuously from the entrance end toward the exit end for the laser light L. Also in the case where the optical reflection reducing region 117Ba has the profile of the optical absorptivity described above, the fixing member 117B can reduce the difference between the amounts of generated heat depending on the positions on the fixing member 117B. Consequently, the fixing member 117B can increase the reliability of the semiconductor laser module. While the optical absorptivity increases linearly and continuously in FIG. 6, it may increase non-linearly and continuously.

Figure 7:
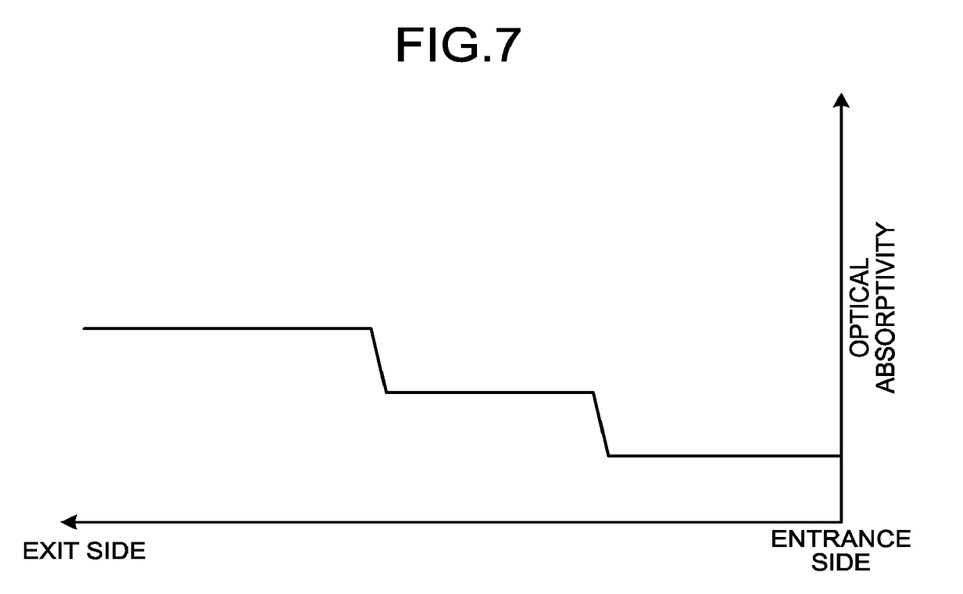
FIG. 7 is a diagram of still another example of the profile of the optical absorptivity.

FIG. 7 is a diagram of still another example of the profile of the optical absorptivity. In the example illustrated in FIG. 7, the optical reflection reducing region 117Ba is formed such that the optical absorptivity gradually increases in three stages from the entrance end toward the exit end for the laser light L. Also in the case where the optical reflection reducing region 117Ba has the profile of the optical absorptivity described above, the fixing member 117B can reduce the difference between the amounts of generated heat depending on the positions on the fixing member 117B. Consequently, the fixing member 117B can increase the reliability of the semiconductor laser module. The optical absorptivity may gradually increase in four or more stages.

Figure 8:
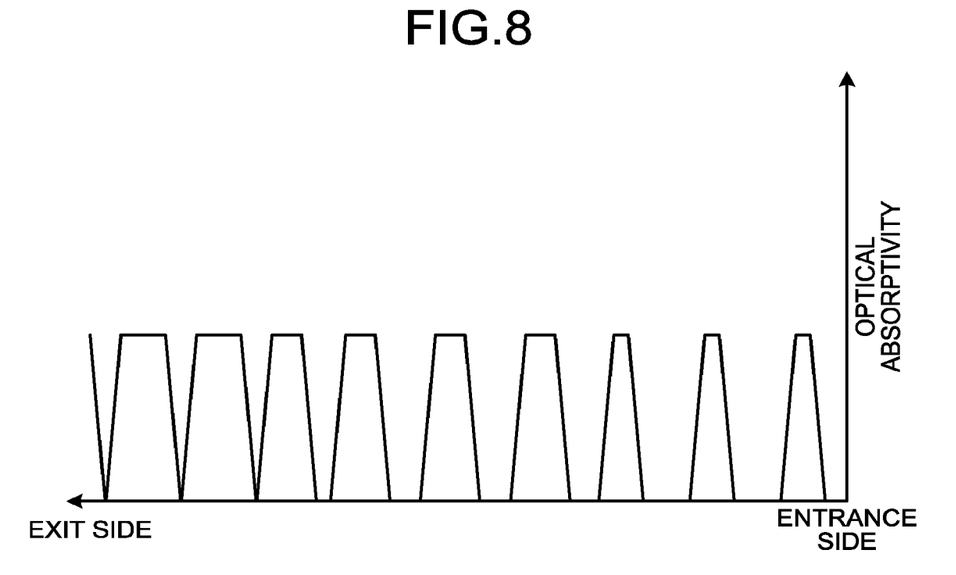
FIG. 8 is a diagram of still another example of the profile of the optical absorptivity.

FIG. 8 is a diagram of still another example of the profile of the optical absorptivity. In the example illustrated in FIG. 8, the optical reflection reducing region 117Ba is formed discontinuously such that the gap between the optical reflection reducing regions 117Ba decreases from the entrance end toward the exit end for the laser light L. The peak value of the optical absorptivity is substantially constant. Also in the case where the optical reflection reducing region 117Ba has the profile of the optical absorptivity described above, the fixing member 117B can reduce the difference between the amounts of generated heat depending on the positions on the fixing member 117B. Consequently, the fixing member 117B can increase the reliability of the semiconductor laser module.

Figure 9:
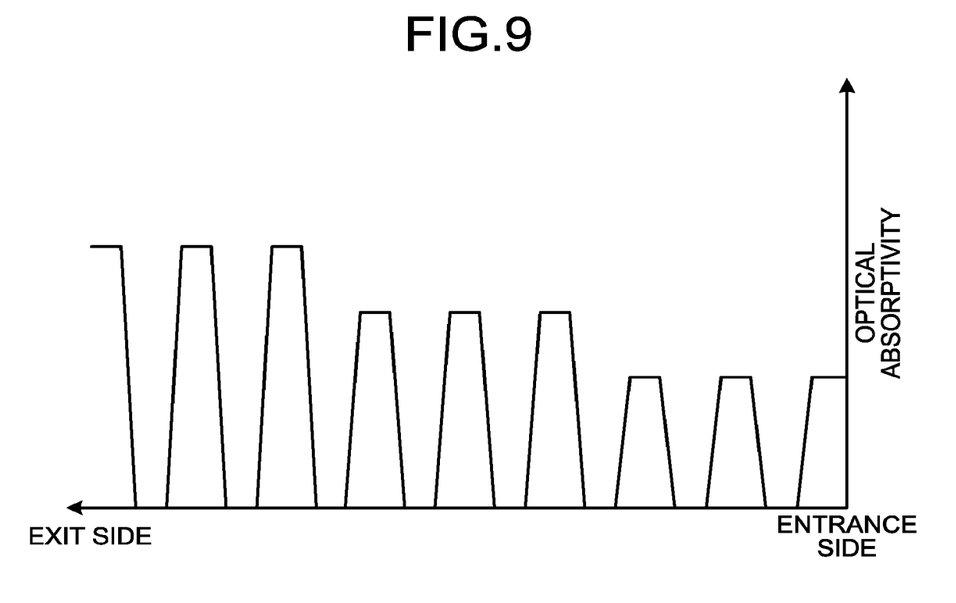
FIG. 9 is a diagram of still another example of the profile of the optical absorptivity.

FIG. 9 is a diagram of still another example of the profile of the optical absorptivity. In the example illustrated in FIG. 9, the optical reflection reducing region 117Ba is formed periodically such that the peak of the optical absorptivity gradually increases from the entrance end toward the exit end for the laser light L. Also in the case where the optical reflection reducing region 117Ba has the profile of the optical absorptivity described above, the fixing member 117B can reduce the difference between the amounts of generated heat depending on the positions on the fixing member 117B. Consequently, the fixing member 117B can increase the reliability of the semiconductor laser module.

The profiles of the optical absorptivity illustrated in FIGS. 6 to 9 can be easily provided by the method of surface-treating the surface by emitting the pulse laser light having different power depending on the positions.

Figure 10:
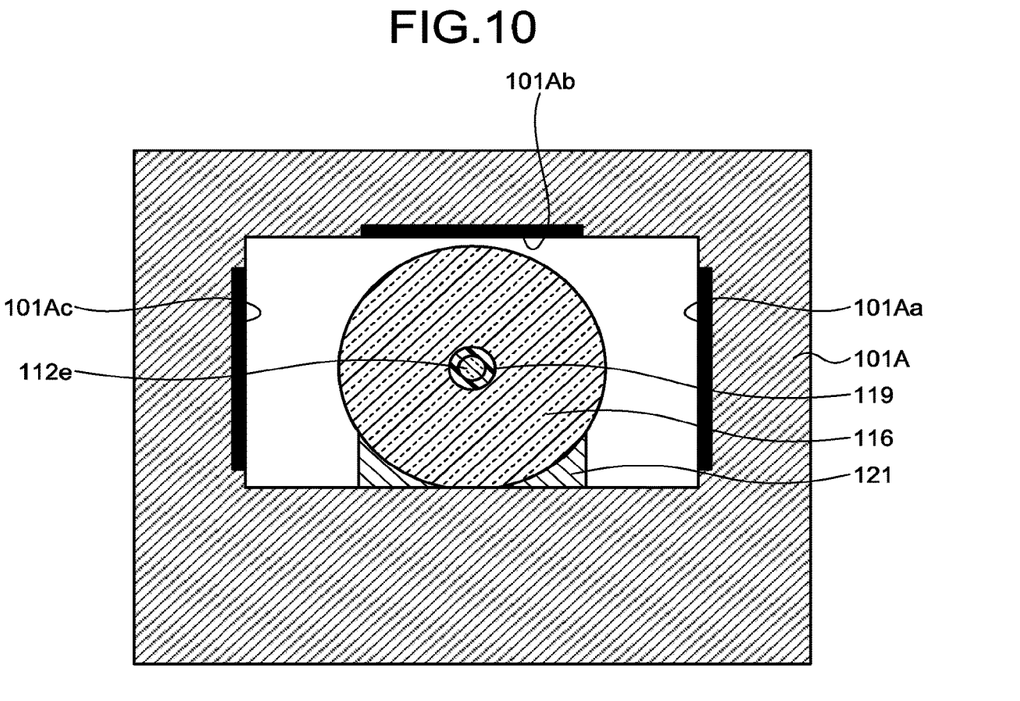
FIG. 10 is a schematic for explaining a housing of the semiconductor laser module according to still another modification.

FIG. 10 is a schematic for explaining the housing of the semiconductor laser module according to still another modification. In the semiconductor laser module according to the modification, in the inner surface of a package 101A, optical reflection reducing regions 101Aa, 101Ab, and 101Ac are formed around the glass capillary 116. The optical reflection reducing regions 101Aa, 101Ab, and 101Ac are formed by treating the inner surface so as to absorb light and have a rough surface. The optical reflection reducing regions 101Aa, 101Ab, and 101Ac are formed selectivity on the inner surface of the package 101A. The glass capillary 116 is fixed to the package 101A with a base 121 instead of the fixing member 117. The base 121 is preferably made of a material having high thermal conductivity and may be a metal member made of various kinds of metals.

Light (corresponding to the light L3 in FIG. 3) propagating in the cladding portion 112d of the glass optical fiber portion 112e and reaching the interface between the glass optical fiber portion 112e and the first fixative 119 sequentially passes through the first fixative 119 and the glass capillary 116 and reaches and is absorbed by the optical reflection reducing regions 101Aa, 101Ab, and 101Ac. Heat generated by the light absorption is radiated through the package 101A. As described above, the optical reflection reducing region may be formed around the glass capillary 116 at a position separated from the outer peripheral surface of the glass capillary 116.

The surface roughness and the optical absorptivity of the optical reflection reducing regions 101Aa, 101Ab, and 101Ac may be the same as those of the optical reflection reducing region 117a of the fixing member 117. The optical reflection reducing regions 101Aa, 101Ab, and 101Ac may be formed by surface-treating the inner surface of the package 101A by selectively emitting the pulse laser light. Alternatively, the optical reflection reducing regions 101Aa, 101Ab, and 101Ac may be formed by surface-treating the inner surface of the package 101A by emitting the pulse laser light having different power depending on the positions.

The optical reflection reducing regions 101Aa, 101Ab, and 101Ac may have the profiles of the optical absorptivity illustrated in FIGS. 5 to 9. In other words, the optical reflection reducing regions 101Aa, 101Ab, and 101Ac may be formed such that the optical absorptivity increases continuously or gradually from the entrance end toward the exit end for the laser light of the optical fiber, formed periodically and in such a manner that the optical absorptivity increases from the entrance end toward the exit end, or formed discontinuously and in such a manner that the gap decreases from the entrance end toward the exit end.

Figure 11:
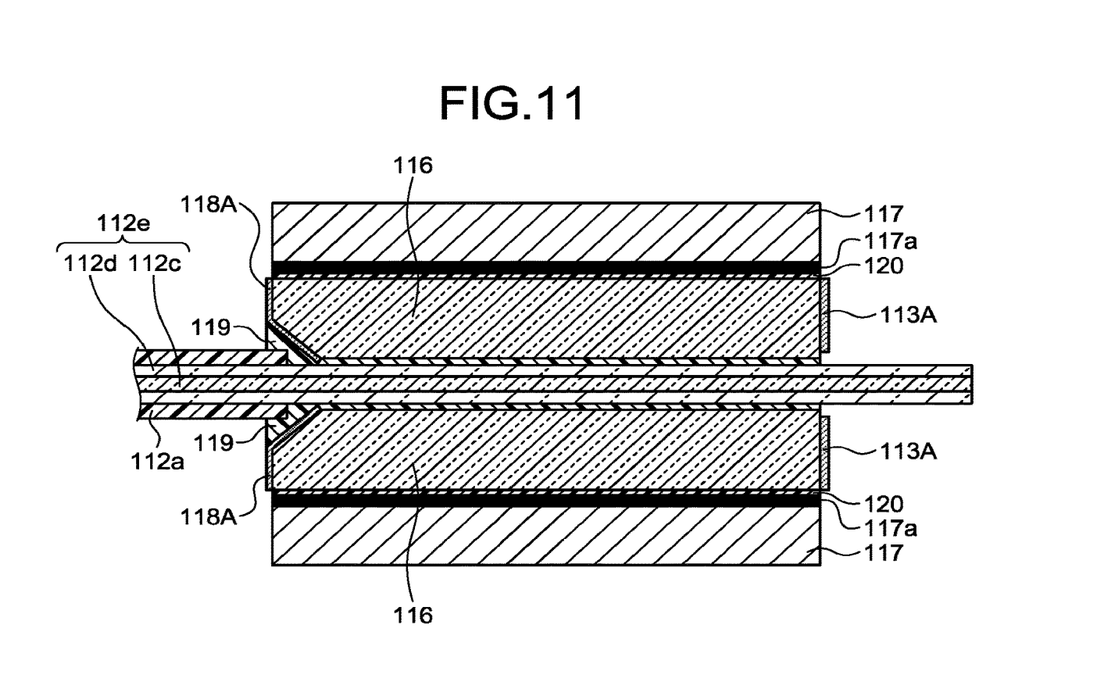
FIG. 11 is a schematic sectional view of the optical fiber, the glass capillary, and the fixing member of the semiconductor laser module according to still another modification.

FIG. 11 is a schematic sectional view of the optical fiber, the glass capillary, and the fixing member of the semiconductor laser module according to still another modification. The semiconductor laser module may include a first light-shielding portion 113A and a second light-shielding portion 118A illustrated in FIG. 13 instead of the first light-shielding portion 113 and the second light-shielding portion 118 illustrated in FIGS. 2 and 3. The first light-shielding portion 113A and the second light-shielding portion 118A are a dielectric multilayer coating or a metal having high reflectivity, for example, provided on the facets of the glass capillary 116. The dielectric multilayer preferably has reflectivity of 90% or more at the wavelength of the laser light output from the semiconductor laser devices 104-1 to 104-6. The distance (clearance) between the first light-shielding portion 113A and the optical fiber 112 is preferably 5 μm or more and 500 μm or less in the major axis direction of the elliptic beam shape of the laser light. While the second light-shielding portion 118A illustrated in FIG. 11 is provided from the facet of the glass capillary 116 to the tapered portion of the through hole, it is not necessarily provided on the tapered portion.

The second light-shielding portion 118A can prevent light passing through the glass capillary 116 and emitted from the facet on the exit side of the glass capillary 116 from being radiated to the outside of the semiconductor laser module 100 and cause the light to be absorbed by the optical reflection reducing region 117a of the fixing member 117. In FIG. 11, the fixing member 117 may be replaced by the fixing member 117A or 117B, for example.

The first light-shielding portion may be a disc having a hole into which the optical fiber 112 is inserted, for example. The shape of the first light-shielding portion is not particularly limited as long as the first light-shielding portion can prevent non-coupled light from entering into the glass capillary.

The glass capillary serving as an optical part may have a refractive index profile on a section orthogonal to the longitudinal direction of the optical fiber. The glass capillary may have a higher refractive index farther away from the center on the section orthogonal to the longitudinal direction of the optical fiber. This structure can efficiently release the entering light to the outside. Consequently, the glass capillary can increase the reliability of the semiconductor laser module.

The glass capillary serving as an optical part preferably prevents the light emitted from the optical fiber to the glass capillary from returning to the optical fiber. While the section of the glass capillary orthogonal to the longitudinal direction of the optical fiber has a circular shape, for example, the central axis of the through hole into which the optical fiber is inserted may be deviated from the central axis of the glass capillary. The section of the glass capillary orthogonal to the longitudinal direction of the optical fiber may have a square shape. Similarly, the section of the glass capillary orthogonal to the longitudinal direction of the optical fiber may have a shape of polygon, flower, or star, for example.

The glass capillary may be a double-core capillary having two through holes or include a light diffusing unit, such as air bubbles.

The semiconductor laser module may include various kinds of heat radiation structures. As a result, the semiconductor laser module can prevent the fixing member or the package from having a high temperature due to light absorption and damaging the second fixative. The heat radiation structure, for example, may be a heat radiation structure including a fin to air-cool the fixing member or the package or a heat radiation structure including a circulating pump to cool the fixing member or the package with water or various kinds of coolants.

As described above, the semiconductor laser module according to the present embodiment or the modifications is a highly reliable semiconductor laser module.

The embodiment described above is not intended to limit the present disclosure. Aspects obtained by appropriately combining the components described above are also included in the present disclosure. Other advantageous effects and modifications are easily conceivable by those skilled in the art. Consequently, a wider range of aspects according to the present disclosure are not limited to the embodiment above, and various changes may be made.

The present disclosure can provide a highly reliable semiconductor laser module.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module comprising:
   a semiconductor laser device that outputs laser light;
   an optical fiber that includes a core portion and a cladding portion formed at an outer periphery of the core portion and that receives the laser light from one end and guides the laser light to the outside of the semiconductor laser module;
   an optical part disposed at an outer periphery of the optical fiber, having optical transmittance at a wavelength of the laser light, and that fixes the optical fiber;
   a first fixative that fixes the optical part and the optical fiber;
   a housing that accommodates the semiconductor laser device and the one end of the optical fiber that receives the laser light; and
   an optical reflection reducing region treated to absorb the laser light passing through the optical part and having a rough surface is formed on an inner surface of a fixing member disposed at an outer periphery around the optical part and fixing the optical part,
   wherein the fixing member:
   includes at least one of:
      a metal member containing Cu, Ni, Al, stainless steel, or Fe;
      a member having a surface plating layer including a metal containing Ni, Cr, or Ti or including C;
      a ceramic member containing AlN, BeO, $ZrO_2$, SiC, or $Al_2O_3$; and
      a member having a ceramic layer covering a surface containing AlN, BeO, $ZrO_2$, SiC, or $Al_2O_3$,
   converts energy of the laser light absorbed by the the optical reflection reducing region into heat and radiates the heat, and
   is connected to the housing with a good thermal conductor interposed therebetween.

2. The semiconductor laser module according to claim 1, wherein the optical reflection reducing region is formed on an inner surface of the housing.

3. The semiconductor laser module according to claim 1, wherein the optical reflection reducing region is formed by surface-treating the inner surface of the housing or the inner surface of the fixing member by emitting pulse laser light.

4. The semiconductor laser module according to claim 1, wherein the optical reflection reducing region is selectively formed on the inner surface of the housing or the inner surface of the fixing member.

5. The semiconductor laser module according to claim 4, wherein the optical reflection reducing region is formed by surface-treating the inner surface of the housing or the inner surface of the fixing member by selectively emitting pulse laser light.

6. The semiconductor laser module according to claim 1, wherein the optical reflection reducing region is formed by surface-treating the inner surface of the housing or the inner surface of the fixing member by emitting pulse laser light having different power depending on a position.

7. The semiconductor laser module according to claim 1, wherein the optical reflection reducing region is formed such that optical absorptivity increases continuously or gradually from an entrance end for the laser light of the optical fiber toward an exit end for the laser light of the optical fiber.

8. The semiconductor laser module according to claim 1, wherein the optical reflection reducing region is formed periodically and in such a manner that optical absorptivity increases from an entrance end for the laser light of the optical fiber toward an exit end for the laser light of the optical fiber.

9. The semiconductor laser module according to claim 1, wherein the optical reflection reducing region is formed discontinuously and in such a manner that a gap decreases from an entrance end for the laser light of the optical fiber toward an exit end for the laser light of the optical fiber.

10. The semiconductor laser module according to claim 1, wherein the optical fiber has a protrusion protruding from the optical part at the entrance end for the laser light.

11. The semiconductor laser module according to claim 10, further comprising:
a first light-shielding portion disposed between the entrance end for the laser light of the optical fiber and the optical part, wherein
the first light-shielding portion is disposed in a manner separated from the optical fiber at an outer periphery of the protrusion.

12. The semiconductor laser module according to claim 11, wherein the first light-shielding portion includes at least one of a metal member containing Cu, Ni, Al, stainless steel, or Fe, a member having a surface plating layer containing Ni, Cr, or Ti, and a member having a dielectric multilayer coating.

13. The semiconductor laser module according to claim 1, wherein the good thermal conductor has thermal conductivity of 0.5 W/mK or more.

14. The semiconductor laser module according to claim 1, further comprising a second light-shielding portion disposed at the exit end for the laser light of the optical fiber and that prevents the laser light from being radiated from the optical part.

15. The semiconductor laser module according to claim 14, wherein the second light-shielding portion includes at least one of a metal member containing Cu, Ni, Al, stainless steel, or Fe and a member having a dielectric multilayer coating.

16. The semiconductor laser module according to claim 14, wherein a surface of the second light-shielding portion facing the optical part has inclination or a curvature so as to reflect light incident on the surface in a direction away from the optical fiber.

17. The semiconductor laser module according to claim 1, wherein the optical part is a cylindrical glass capillary.

* * * * *